United States Patent
Fazzio

(10) Patent No.: US 8,138,025 B2
(45) Date of Patent: Mar. 20, 2012

(54) MICROCAP WAFER BONDING METHOD AND APPARATUS

(75) Inventor: R Shane Fazzio, Loveland, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 185 days.

(21) Appl. No.: 12/624,255

(22) Filed: Nov. 23, 2009

(65) Prior Publication Data

US 2010/0068844 A1 Mar. 18, 2010

Related U.S. Application Data

(62) Division of application No. 10/807,417, filed on Mar. 23, 2004, now Pat. No. 7,642,642.

(51) Int. Cl.
H01L 21/52 (2006.01)

(52) U.S. Cl. ............ 438/118; 438/25; 438/51; 438/64; 438/112; 257/E21.502

(58) Field of Classification Search ............ 257/773, 257/E21.502; 438/25–26, 51, 64, 112, 118
See application file for complete search history.

(56) References Cited

U.S. PATENT DOCUMENTS

| | | |
|---|---|---|
| 6,046,074 A | 4/2000 | McHerron et al. |
| 6,459,160 B1 | 10/2002 | Goldmann et al. |
| 6,717,052 B2 | 4/2004 | Wang et al. |
| 6,770,885 B2 | 8/2004 | Eberhard et al. |
| 6,787,897 B2 | 9/2004 | Geefay et al. |
| 2003/0061693 A1 | 4/2003 | Kikushima et al. |
| 2003/0062830 A1 | 4/2003 | Guenther et al. |
| 2003/0143423 A1 | 7/2003 | McCormick et al. |
| 2003/0153127 A1 * | 8/2003 | Wada et al. ............ 438/118 |
| 2004/0211966 A1 | 10/2004 | Guenther et al. |
| 2005/0056917 A1 * | 3/2005 | Kwon ............ 257/678 |

OTHER PUBLICATIONS

Merriam-Webster Online Dictionary, website retrieved from: www.m-w.com, date unknown.
Bellex International Corp., "Cytop Amorphous Fluorocarbon Polymer", Date Unknown, 2 pages.

* cited by examiner

Primary Examiner — Minchul Yang

(57) ABSTRACT

A method of fabricating an apparatus including a sealed cavity and an apparatus embodying the method are disclosed. To fabricate the apparatus, a device chip including a substrate and at least one circuit element on the substrate is fabricated. Also, a cap is fabricated. Next, the device chip and the cap are bonded such that a sealed cavity is formed by the device chip and the cap. The bond is accomplished using thermo compression technique. Gold or other suitable metal can be used as a bonding agent. Then or at the same time, caulking agent is reflowed over the bonding agent, over portions of the cap, or both to further seal the cavity. In the resultant device, the sealed cavity is sealed by the bonding agent, the caulking agent, or both. The caulking agent increases hermeticity of the cavity and provides for even higher level of protection of the cavity against adverse environmental conditions.

8 Claims, 2 Drawing Sheets

MICROCAP WAFER BONDING METHOD AND APPARATUS

This patent application is a divisional application of parent U.S. patent application Ser. No. 10/807,417 filed Mar. 23, 2004 entitled "Microcap Wafer Bonding Method and Apparatus" to R. Shane Fazzio, and claims priority and other benefits therefrom. The foregoing '417 patent application is hereby incorporated by reference herein, in its entirety.

BACKGROUND

The present invention relates to integrated circuit (IC) fabrication technology, and more particularly, to a method of fabricating an IC having a sealed cavity.

Some products use packaging technology that involves bonding a cap over a predetermined area of a substrate to create a hermetically sealed cavity. The hermetically sealed cavity is often formed to protect sensitive circuit elements therein. FIG. 1 is a perspective illustration of a sample apparatus 10 including a device chip 20 having a substrate 22 and circuit elements 24 fabricated on the substrate 22. A cap 30 is attached, via thereto compression bond, over the device chip 20 defining a hermetically sealed cavity within which the circuit elements 24 are protected.

FIG. 2 illustrates a cut-away side view of the apparatus 10 of FIG. 1 after the bonding process. The hermetically sealed cavity is indicated with reference number 26. As illustrated, bottom of the hermetically sealed cavity 26 is defined by the device chip 20 including the substrate 22 and the circuit elements 24. Top of the hermetically sealed cavity 26 is defined by the cap 30. The sizes of the device chip 20 and the cap 30 can vary greatly depending on implementation but can be, for example, on the order of millimeters (mm) or fractions of millimeters, for example, about 0.5 mm to 2 mm.

Sides of the hermetically sealed cavity 26 are defined by gasket 32 which can be a part of the cap 30. The gasket 32 is attached to the substrate 22 using bonding agent 34 such as gold. To achieve the hermetically sealed cavity 26, the bonding agent 34 is applied to the substrate 22, the gasket 32, or both before they are brought together. As for the bonding metal 34, gold (chemical symbol Au) is often used but other materials can be used as the bonding agent. Then, the device chip 20 and the cap 30 are pressed together and heated to effectuate diffusion bonding. The gasket 32 can be about 1 to 10 microns thick depending on implementation. This process results in a hermetic sealing of the cavity 26; however, long-term exposure to harsh environmental conditions such as high temperature, high humidity, or both can lead to corrosion and leaking of the bond agent thus losing the hermeticity of the cavity.

Accordingly, there remains a need for a method of manufacturing an apparatus with sealed cavity that provides even higher level of protection against adverse environmental conditions.

SUMMARY

The need is met by the present invention. In one embodiment of the present invention, an apparatus including a device chip and a cap is disclosed. The device chip includes substrate and at least one circuit element fabricated on the substrate. The cap is bonded to the device chip such that the device chip and the cap define a hermetically sealed cavity where the cavity is sealed with bonding agent and caulking agent.

In another embodiment of the present invention, a method of manufacturing an apparatus is disclosed. A device chip including a substrate and at least one circuit element on the substrate is fabricated. A cap is fabricated. Next, the device chip and the cap are bonded such that a sealed cavity is formed by the device chip and the cap. Then, caulking agent is reflowed to further seal the cavity.

Other aspects and advantages of the present invention will become apparent from the following detailed description, taken in conjunction with the accompanying drawings, illustrating by way of example the principles of the invention.

DETAILED DESCRIPTION

The present invention will now be described with reference to FIGS. 1 through 3C which illustrate various embodiments of the present invention. In the Figures, some sizes of structures or portions may be exaggerated relative to sizes of other structures or portions for illustrative purposes and, thus, are provided to illustrate the general structures of the present invention. Furthermore, various aspects of the present invention are described with reference to a structure or a portion positioned "above" or "over" relative to other structures, portions, or both. As will be appreciated by those of skill in the art, relative terms and phrases such as "above" or "over" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "above" or "over" other structures or portions would now be oriented "below," "under," "left of," "right of," "in front of," or "behind" the other structures or portions.

As shown in the Figures for the purposes of illustration, embodiments of the present invention are exemplified by an apparatus having a device chip and a cap bonded to the device chip, the device chip and the cap defining a sealed cavity. The cavity is sealed with bonding agent and with caulking agent to reinforce the seal thus providing even higher level of protection against adverse environmental conditions.

Figure 1:
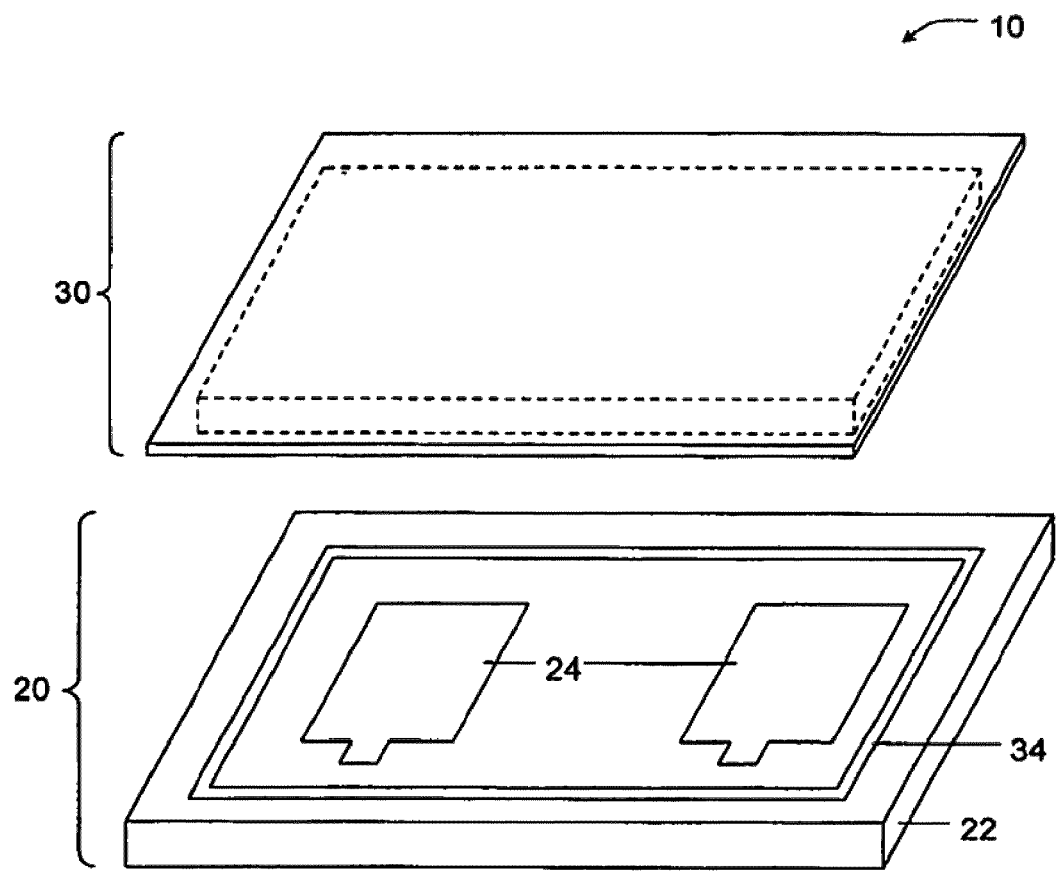
FIG. 1 is a perspective illustration of a sample apparatus.
Figure 2:
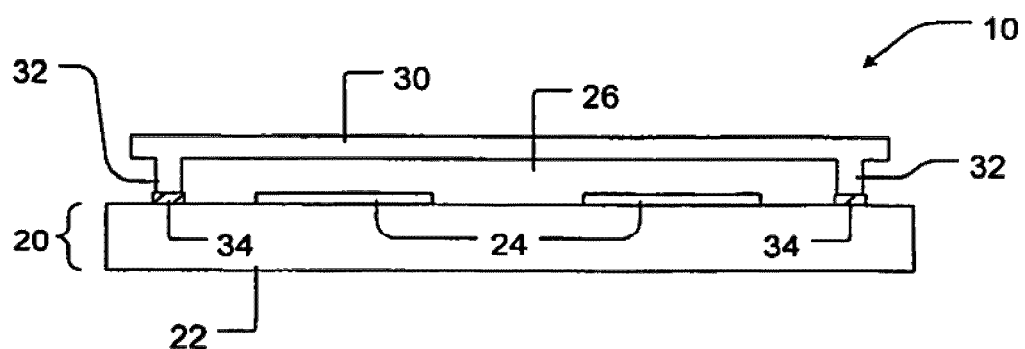
FIG. 2 is a cut-away side view of the apparatus of FIG. 1 following a bonding process.
Figure 3A:
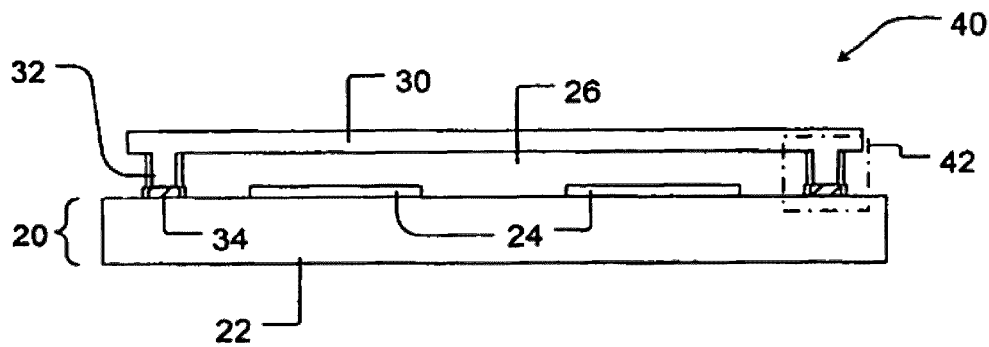
FIG. 3A is a cut-away side view of a apparatus according to one embodiment of the present invention.

FIG. 3A is a cut-away side view of an apparatus 40 according to one embodiment of the present invention. A portion 42 of FIG. 3A is illustrated in more detail in FIGS. 3B and 3C. The apparatus 40 of FIGS. 3A through 3C includes portions similar to corresponding portions of the apparatus 10 of FIGS. 1 and 2. For convenience, portions of the apparatus 40 of FIGS. 3A through 3C that are similar to corresponding portions of the apparatus 10 of FIGS. 1 and 2 are assigned the same reference numerals; different portions are assigned different reference numerals.

Figure 3B:
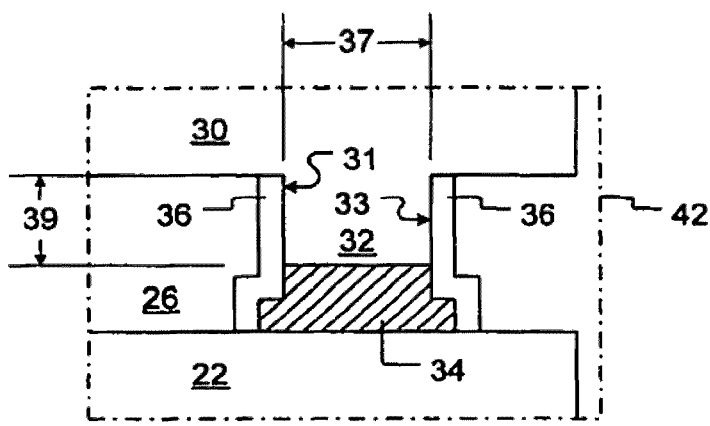
FIG. 3B is a portion of cut-away side view the apparatus of FIG. 3A in more detail.

Referring to FIGS. 3A and 3B, the apparatus 40 includes a device chip 20 including substrate 22 and at least one circuit element 24 fabricated on the substrate 22. The substrate 22 can be, for example, a silicon substrate 22. The circuit element 24 can be, for example, resonators, transistors, or connectors.

A cap 30, including gasket 32, is bonded to the device chip 20 such that the device chip 20 and the cap 30 define a hermetically sealed cavity 26. As illustrated, bottom of the hermetically sealed cavity 26 is defined by the device chip 20 including the substrate 22 and the circuit elements 24. Top of the hermetically sealed cavity 26 is defined by the cap 30. The sizes of the device chip 20 and the cap 30 are on the order of millimeters or fraction of millimeters. Sides of the hermetically sealed cavity 26 are defined by the gasket 32 which can be a part of the cap 30. Depending on the desired application, the gasket 32 can have thickness 37 in the order of microns or tens of microns and have a length 39 in the order of microns or tens of microns. Again, these ranges are examples only. The sizes of these portions can vary widely outside the stated ranges depending on the desired implementation.

The gasket 32 is attached to the substrate 22 using bonding agent 34 such as gold. To achieve the hermetically sealed cavity 26, the bonding agent 34 is applied to the substrate 22, the gasket 32, or both before they are brought together. As for the bonding metal 34, gold (chemical symbol Au) is often used. Then, the device chip 20 and the cap 30 are pressed together and heated to effectuate diffusion bonding. This technique is also known as thermo compression bonding. This process results in a hermetic sealing of the cavity 26.

Here, in addition to the bonding agent 34, caulking agent 36 is used to seal the cavity 26. The bonding agent 34 is thermo compressed at a temperature, "bonding temperature" that depends on the bonding agent material. For gold, a bonding temperature of ranging between, for example, approximately 600 to 670 degrees Kelvin but this range can vary greatly depending on material, pressure, and time. Various materials can be used as the caulking agent 36, for example, amorphous fluorocarbon polymer such as Cytop®, polyimide materials, and benzocyclobutene (BCH) based materials. It is desirable that the caulking agent 36 has dispense and patterning properties that are compatible with the rest of the wafer manufacturing process. For example, the caulking agent and the process for depositing caulking agents should not have adverse reactions or impact against other parts of the circuit.

For example, it is desirable that the caulking agent 36 has a reflow temperature that is compatible with the rest of the bonding process. If the reflow temperature is too low, then the caulking agent 36 may not caulk the gasket 32, but rather flow throughout the die or adversely penetrate the bonding agent. If the reflow temperature is too high, then the caulking agent 36 will not flow and caulking will not occur. Additionally, the caulking agent 36 should not include material that adversely affects the device chip 20, its circuits 24, or the cap 30.

As illustrated in FIGS. 3A and 3B, the caulking agent 36 caulks and envelopes portions of or all of the bonding agent 34 and the gasket 32 which is a part of the cap 30. The gasket 32 has an inner surface 31 and an outer surface 33 where the inner surface 31 is exposed to the cavity 26. The caulking agent 36 can be used to caulk the inner surface 31, the outer surface 33, or both. Only one layer of the caulking agent 36 is illustrated for simplicity. However, depending on the application, two or more layers of the caulking agent 36 can be used where the layers can be different caulking material relative to the other layers or multiple layers of the same caulking material.

Figure 3C:
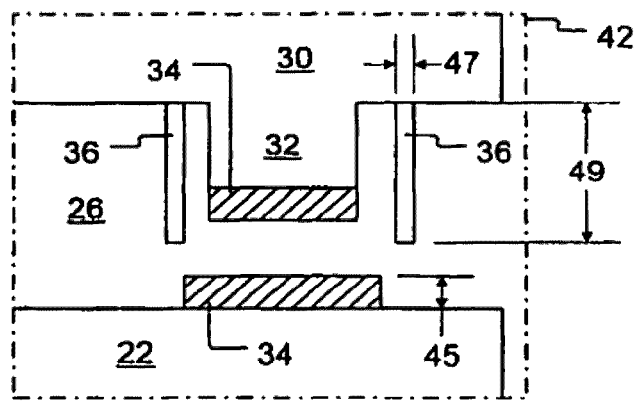
FIG. 3C is the portion illustrated in FIG. 3B prior to a bonding step.

To manufacture the apparatus 40, the device chip 20 is fabricated including the substrate 22 and at least one circuit element 24 on the substrate. Also, the cap 30 is fabricated. The bonding agent 34 can be applied to or fabricated on the device chip 20, the cap 30, or both when these are fabricated. Likewise, the caulking agent 36 can be applied to or fabricated on the device chip 20, the cap 30, or both when these are fabricated. FIG. 3C illustrates the portion 42 before the cap 30 is bonded to the device chip 20.

In the illustrated embodiment, the bonding agent 34 is deposited on both the device chip 20 and the cap 30, but the caulking agent 36 is fabricated on the cap 30 only. The bonding agent 34 is deposited with a thickness 45 in the order of microns in the present embodiment, but this can vary with the different processes. The caulking agent 36 is deposited with a thickness 47 in the order of microns or tens of microns and sufficient length 49 to cover the length of the gasket 32 including the bonding agent 34. For example, the length 49 can be in a range of approximately microns to tens of microns.

Next, the cap 30 is attached to the device chip 20 using thereto compression technique to result in diffusion bonding of the bonding agent 34. At the same time, the bonding temperature causes the caulking agent 36 to reflow to further seal the cavity 26. The reflow step can be performed before or after the diffusion bonding of the bonding agent 34 if needed. In the illustrated embodiment, the bonding process, including the reflow step, is effectuated between approximately 600 to 670 degrees Kelvin but this range can vary greatly depending on material, pressure, and time. Pressure, in the illustrated embodiment, is within a range of approximately 15 to 60 mega pascals of localized pressure at the bond interface. For the present example, the bonding temperature and the bonding pressure are applied in the range of minutes and tens of minutes. Again, all these values (temperatures, pressure, and time) can vary greatly depending on many factors including, for example, the material, size, and the process technology as well as the time-temperature-pressure relationship.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A method of manufacturing an apparatus, the method comprising:
   fabricating a device chip including a substrate and at least one circuit element on the substrate;
   fabricating a cap;
   bonding the cap on the device chip using a bonding agent such that a hermetically sealed cavity is formed, and such that the bonding agent comprises opposing inner and outer vertical sidewalls, and portions of the bonding agent are in direct contact with portions of the cap and the device chip; and
   reflowing a caulking agent in direct contact with the bonding agent, such that the hermeticity of the cavity seal is increased;
   wherein the caulking agent caulks at least a portion of the inner vertical sidewall of the bonding agent.

2. The method recited in claim 1 wherein the step of fabricating the device chip includes a step of depositing the caulking agent on the device chip.

3. The method recited in claim 1 wherein the step of fabricating the cap includes a step of depositing the caulking agent on the cap, the step of fabricating the cap occurring prior to the step of bonding the cap on the device chip.

4. The method recited in claim 1 wherein the bonding agent comprises gold.

5. The method recited in claim 1 wherein the caulking agent is selected from a group consisting of amorphous fluorocarbon polymer, polyimide materials, and benzocyclobutene (BCB) based materials.

6. The method recited in claim 1 wherein the circuit element comprises a resonator.

7. The method recited in claim 1 wherein the caulking agent caulks at least a portion of the outer vertical sidewall of the bonding agent.

8. The method recited in claim 1 wherein the cap includes a gasket that is caulked by the caulking agent.

* * * * *